United States Patent
Han

(10) Patent No.: US 9,257,649 B2
(45) Date of Patent: Feb. 9, 2016

(54) METHOD OF MANUFACTURING ORGANIC LAYER ON A SUBSTRATE WHILE FIXED TO ELECTROSTATIC CHUCK AND CHARGING CARRIER USING CONTACTLESS POWER SUPPLY MODULE

(71) Applicant: SAMSUNG DISPLAY CO., LTD., Yongin-si, Gyeonggi-do (KR)

(72) Inventor: Kyu-Seob Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/791,899

(22) Filed: Mar. 8, 2013

(65) Prior Publication Data

US 2014/0014918 A1   Jan. 16, 2014

(30) Foreign Application Priority Data

Jul. 10, 2012   (KR) .................. 10-2012-0075142

(51) Int. Cl.
| | |
|---|---|
| H01L 51/56 | (2006.01) |
| H01L 21/677 | (2006.01) |
| H01L 51/00 | (2006.01) |
| H01L 51/52 | (2006.01) |
| C23C 14/04 | (2006.01) |
| C23C 14/56 | (2006.01) |

(52) U.S. Cl.
CPC .......... *H01L 51/0002* (2013.01); *C23C 14/042* (2013.01); *C23C 14/568* (2013.01); *H01L 21/6776* (2013.01); *H01L 21/67745* (2013.01); *H01L 51/0004* (2013.01); *H01L 51/0011* (2013.01); *H01L 51/5296* (2013.01); *H01L 51/56* (2013.01)

(58) Field of Classification Search
CPC .................................................. H01L 51/0011
See application file for complete search history.

(56) References Cited

U.S. PATENT DOCUMENTS

| | | | |
|---|---|---|---|
| 4,468,648 | A | 8/1984 | Uchikune |
| 5,487,609 | A | 1/1996 | Asada |
| 5,909,995 | A | 6/1999 | Wolf et al. |
| 6,274,198 | B1 | 8/2001 | Dautartas |

(Continued)

FOREIGN PATENT DOCUMENTS

| | | |
|---|---|---|
| CN | 1704501 A | 12/2005 |
| CN | 1841696 A | 10/2006 |

(Continued)

OTHER PUBLICATIONS

Chinese Office Action dated Oct. 9, 2012, for corresponding Chinese Patent Application No. 2010-10266406.6, 6 pages.

(Continued)

*Primary Examiner* — Stephen W Smoot
(74) *Attorney, Agent, or Firm* — Christie, Parker & Hale, LLP

(57) ABSTRACT

An organic layer deposition apparatus, a method of manufacturing an organic light-emitting display device by using the same, and an organic light-emitting display device manufactured using the method, and in particular, an organic layer deposition apparatus that is suitable for use in the mass production of a large substrate and enables high-definition patterning, a method of manufacturing an organic light-emitting display device by using the same, and an organic light-emitting display device manufactured using the method.

15 Claims, 11 Drawing Sheets

(56) References Cited

U.S. PATENT DOCUMENTS

| | | |
|---|---|---|
| 6,371,451 B1 | 4/2002 | Choi |
| 6,483,690 B1 | 11/2002 | Nakajima et al. |
| 6,749,906 B2 | 6/2004 | Van Slyke |
| 6,995,035 B2 | 2/2006 | Cok et al. |
| 7,964,037 B2 | 6/2011 | Fukuda et al. |
| 2001/0006827 A1 | 7/2001 | Yamazaki et al. |
| 2002/0076847 A1 | 6/2002 | Yamada et al. |
| 2002/0168577 A1 | 11/2002 | Yoon |
| 2002/0194727 A1 | 12/2002 | Cho et al. |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0166842 A1 | 8/2005 | Sakamoto |
| 2005/0263074 A1 | 12/2005 | Masuda et al. |
| 2006/0102078 A1 | 5/2006 | Fairbairn et al. |
| 2006/0144325 A1 | 7/2006 | Jung et al. |
| 2006/0164786 A1 | 7/2006 | Kobayashi et al. |
| 2006/0174829 A1 | 8/2006 | An et al. |
| 2006/0205101 A1 | 9/2006 | Lee et al. |
| 2006/0255722 A1 | 11/2006 | Imanishi |
| 2006/0278522 A1 | 12/2006 | Kim et al. |
| 2007/0009652 A1 | 1/2007 | Manz et al. |
| 2007/0046913 A1 | 3/2007 | Shibazaki |
| 2007/0077358 A1 | 4/2007 | Jeong et al. |
| 2007/0178708 A1 | 8/2007 | Ukigaya |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2008/0298947 A1 | 12/2008 | Yeo et al. |
| 2009/0017192 A1 | 1/2009 | Matsuura |
| 2009/0153033 A1 | 6/2009 | Lee et al. |
| 2009/0229524 A1 | 9/2009 | Kim et al. |
| 2009/0232976 A1 | 9/2009 | Yoon et al. |
| 2010/0130020 A1 | 5/2010 | Kim et al. |
| 2010/0156279 A1 | 6/2010 | Tamura et al. |
| 2011/0241438 A1 | 10/2011 | Kim et al. |
| 2013/0341598 A1* | 12/2013 | Chang et al. ........... 257/40 |
| 2014/0014917 A1* | 1/2014 | Lee et al. ................ 257/40 |

FOREIGN PATENT DOCUMENTS

| | | |
|---|---|---|
| EP | 1 413 644 A2 | 4/2004 |
| EP | 1 418 250 A2 | 5/2004 |
| EP | 1 518 940 A1 | 3/2005 |
| JP | 04-272170 | 9/1992 |
| JP | 1993-022405 U | 3/1993 |
| JP | 10-120171 | 5/1998 |
| JP | 2000-068054 | 3/2000 |
| JP | 2001-028325 A | 1/2001 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2003-347394 A | 12/2003 |
| JP | 2004-043898 A | 2/2004 |
| JP | 2004-103269 A | 4/2004 |
| JP | 2004-103341 A | 4/2004 |
| JP | 2004-199919 A | 7/2004 |
| JP | 2004-342455 A | 12/2004 |
| JP | 2005-044592 A | 2/2005 |
| JP | 2005-213616 A | 8/2005 |
| JP | 2005-235568 A | 9/2005 |
| JP | 2005-293968 A | 10/2005 |
| JP | 2005-296737 A | 10/2005 |
| JP | 2006-275433 A | 10/2006 |
| JP | 2006-307247 A | 11/2006 |
| JP | 2007-047293 A | 2/2007 |
| JP | 2008-019477 A | 1/2008 |
| JP | 2008-121098 A | 5/2008 |
| JP | 2009-019243 A | 1/2009 |
| JP | 2009-87910 A | 4/2009 |
| JP | 2009-117231 A | 5/2009 |
| JP | 2010-159167 A | 7/2010 |
| KR | 1997-0008709 A | 3/1997 |
| KR | 10-0257219 B1 | 2/2000 |
| KR | 10-2000-0019254 A | 4/2000 |
| KR | 10-2000-0023929 A | 5/2000 |
| KR | 10-2001-0059939 A | 7/2001 |
| KR | 10-2002-0000201 A | 1/2002 |
| KR | 10-2002-0050922 A | 6/2002 |
| KR | 10-2002-0088662 A | 11/2002 |
| KR | 10-2002-0090934 A | 12/2002 |
| KR | 10-2003-0043012 A | 6/2003 |
| KR | 10-0405080 B1 | 11/2003 |
| KR | 10-0406059 A | 11/2003 |
| KR | 10-2003-0091947 A | 12/2003 |
| KR | 10-2003-0093959 A | 12/2003 |
| KR | 10-2004-0034537 A | 4/2004 |
| KR | 10-0430336 A1 | 5/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0024324 A | 3/2005 |
| KR | 10-0520159 B1 | 10/2005 |
| KR | 10-2006-0008602 A | 1/2006 |
| KR | 10-2006-0018745 A | 3/2006 |
| KR | 10-2006-0073367 A | 6/2006 |
| KR | 10-2006-0077887 A | 7/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 5/2007 |
| KR | 10-2007-0056190 A | 6/2007 |
| KR | 10-0726132 B1 | 6/2007 |
| KR | 10-0736218 B1 | 7/2007 |
| KR | 10-0741142 B1 | 7/2007 |
| KR | 10-2007-0078713 A | 8/2007 |
| KR | 10-2007-0080635 A | 8/2007 |
| KR | 10-2007-0091437 A | 9/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0823508 B1 | 4/2008 |
| KR | 10-2008-0044239 A | 5/2008 |
| KR | 10-2008-0046761 A | 5/2008 |
| KR | 10-0827760 B1 | 5/2008 |
| KR | 10-2008-0057159 A | 6/2008 |
| KR | 10-0839380 B1 | 6/2008 |

(56) References Cited

FOREIGN PATENT DOCUMENTS

| | | |
|---|---|---|
| KR | 10-2008-0060400 A | 7/2008 |
| KR | 10-2008-0061132 A | 7/2008 |
| KR | 10-2008-0062212 A | 7/2008 |
| KR | 10-2008-0076574 A | 8/2008 |
| KR | 10-2008-0104479 A | 12/2008 |
| KR | 10-2008-0104695 A | 12/2008 |
| KR | 10-2009-0038733 A | 4/2009 |
| KR | 10-0899279 B1 | 5/2009 |
| KR | 10-2009-0066996 A | 6/2009 |
| KR | 10-2009-0075887 A | 7/2009 |
| KR | 10-2009-0079765 A | 7/2009 |
| KR | 10-2009-0081717 A | 7/2009 |
| KR | 10-2009-0094911 A | 9/2009 |
| KR | 10-2009-0097453 A | 9/2009 |
| KR | 10-2010-0038088 A | 4/2010 |
| KR | 10-2010-0044606 A | 4/2010 |
| KR | 10-2010-0128589 A | 12/2010 |
| KR | 10-1017654 B1 | 2/2011 |
| KR | 10-2011-0110525 A | 10/2011 |
| KR | 10-1157332 B1 | 6/2012 |
| WO | WO 03/043067 A1 | 5/2003 |
| WO | WO 2004/016406 A | 2/2004 |

OTHER PUBLICATIONS

English Abstract, Publication No. 1020080002189, dated Jan. 4, 2008, for corresponding Korean Patent 10-0800125 listed above.
European Search Report dated May 27, 2011, for corresponding European Patent application 10251514.5, 11 pages.
KIPO Notice of Allowance dated Apr. 26, 2012, for Korean Patent application 10-2010-0066991, (5 pages).
KIPO Office action dated Apr. 9, 2012, for Korean priority Patent application 10-2010-0031556, (4 pages).
KIPO Office action dated Feb. 6, 2012, for Korean Patent application 10-2010-0011481, 7 pages.
KIPO Office action dated Feb. 6, 2012, for Korean Patent application 10-2010-0011480, 8 pages.
KIPO Registration Determination Certificate dated Jul. 2, 2012, for Korean Patent application 10-2010-0011480, (5 pages).
KIPO Registration Determination Certificate dated Jul. 2, 2012, for Korean priority Patent application 10-2010-0011481, (5 pages).
Korean Patent Abstracts, Publication No. 10-0151312 B1, dated Jun. 18, 1998, corresponding to Korean Publication 1997-0008709 listed above.
Korean Patent Abstracts, Publication No. 1020010062735, dated Jul. 7, 2001, for corresponding Korean Patent 10-0827760 listed above.
Korean Patent Abstracts, Publication No. 1020020034272, dated May 9, 2002, for corresponding Korean Patent 10-0726132 listed above.
Korean Patent Abstracts, Publication No. 1020020056238, dated Jul. 10, 2002, for corresponding Korean Patent 10-0698033 listed above.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020040062203, dated Jul. 7, 2002, for corresponding Korean Patent 10-0646160 listed above.
Korean Patent Abstracts, Publication No. 1020050045619, dated May 17, 2005, for corresponding Korean Patent 10-0520159 listed above.
Korean Patent Abstracts, Publication No. 1020050078637, dated Aug. 5, 2005, for corresponding Korean Patent 10-0700466 listed above.
Korean Patent Abstracts, Publication No. 1020060101987, dated Sep. 27, 2006, for corresponding Korean Patent 10-0687007 listed above.
Korean Patent Abstracts, Publication No. 1020060126267, dated Dec. 6, 2006, for corresponding Korean Patent 10-0797787 listed above.
Korean Patent Abstracts, Publication No. 1020070025164, dated Mar. 8, 2007, for corresponding Korean Patent 10-0711885 listed above.
Korean Patent Abstracts, Publication No. 10-2007-0056241, dated Jun. 4, 2007, corresponding to Korean Patent 10-0741142 B1 listed above.
Korean Patent Abstracts, Publication No. 1020080038650, dated May 7, 2008, for corresponding Korean Patent 10-0839380 listed above.
Korean Patent Abstracts, Publication No. 10-2008-0070302, dated Jul. 30, 2008, corresponding to Korean Patent 10-0899279 B1 listed above.
Patent Abstracts of Japan, and English machine translation of Japanese Publication 2001-052862, 20 pages, published Feb. 2001.
Patent Abstracts of Japan, and English machine translation of Japanese Publication 2003-003250, 25 pages, published Jan. 2003.

* cited by examiner

METHOD OF MANUFACTURING ORGANIC LAYER ON A SUBSTRATE WHILE FIXED TO ELECTROSTATIC CHUCK AND CHARGING CARRIER USING CONTACTLESS POWER SUPPLY MODULE

CROSS-REFERENCE TO RELATED PATENT APPLICATION

This application claims priority to and the benefit of Korean Patent Application No. 10-2012-0075142, filed on Jul. 10, 2012, in the Korean Intellectual Property Office, the disclosure of which is incorporated herein in its entirety by reference.

BACKGROUND

1. Field of the Invention

The following description relates to an organic layer deposition apparatus, a method of manufacturing an organic light emitting display apparatus using the apparatus, and an organic light emitting display apparatus manufactured using the method, and more particularly, to an organic layer deposition apparatus that is suitable for use in mass production of a large substrate and enables high definition patterning, a method of manufacturing an organic light emitting display apparatus by using the apparatus, and an organic light emitting display apparatus manufactured using the method.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) disposed between a first electrode and a second electrode that are arranged opposite to each other. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display devices using a large mother glass. For example, when such a large mask is used, the mask may bend due to a gravitational pull, thereby distorting its pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was already known to the inventors of the present invention before achieving the present invention or is technical information acquired in the process of achieving the present invention. Therefore, it may contain information that does not form the prior art that is already known in this country to a person of ordinary skill in the art.

SUMMARY

Aspects of embodiments of the present invention are directed toward an organic layer deposition apparatus that is suitable for use in mass production of a large substrate and enables high definition patterning, a method of manufacturing an organic light emitting display apparatus by using the apparatus, and an organic light emitting display apparatus manufactured using the method.

According to an embodiment of the present invention, there is provided an organic layer deposition apparatus including: a conveyer unit including a transfer unit for fixing a substrate and configured to move along with the substrate, a first conveyer unit for moving in a first direction the transfer unit on which the substrate is fixed, and a second conveyer unit for moving in a direction opposite to the first direction the transfer unit from which the substrate is separated after deposition has been completed; and a deposition unit including a chamber maintained in a vacuum state and at least one organic layer deposition assembly for depositing an organic layer on the substrate fixed on the transfer unit. The transfer unit includes a carrier including a contactless power supply (CPS) module and an electrostatic chuck fixedly coupled to the carrier to fix the substrate. The transfer unit is configured to circulate between the first conveyer unit and the second conveyer unit, and the substrate fixed on the transfer unit is configured to be spaced apart from the organic layer deposition assembly by a set distance while being transferred by the first conveyer unit.

A charging track may be formed on a location corresponding to the CPS module in the second conveyer unit so that a magnetic field is formed between the charging track and the CPS module when the carrier is conveyed in the second conveyer unit and an electric power may be supplied to the CPS module in a non-contact manner.

The first conveyer unit may include a pair of guide rails that are formed in parallel with each other and guide blocks coupled to the guide rails.

The charging track may be formed in the guide rail at a portion corresponding to the CPS module so that a magnetic field is formed between the charging track and the CPS module when the carrier is conveyed in the first conveyer unit and an electric power is supplied to the CPS module in a non-contact manner.

An iron chuck adsorbing the substrate may be further formed at a side of the electrostatic chuck, and the substrate may contact the iron chuck.

The first conveyer unit and the second conveyer unit may be configured to pass through the deposition unit.

The first conveyer unit and the second conveyer unit may be respectively arranged above and below in parallel to each other.

The organic layer deposition apparatus may further include: a loading unit for fixing the substrate on the transfer unit; and an unloading unit for separating, from the transfer unit, the substrate on which the deposition has been completed while passing through the deposition unit.

The first conveyer unit may be configured to sequentially convey the transfer unit into the loading unit, the deposition unit, and the unloading unit.

The second conveyer unit may be configured to sequentially convey the transfer unit into the unloading unit, the deposition unit, and the loading unit.

The organic layer deposition assembly may include: a deposition source for discharging a deposition material; a deposition source nozzle unit at a side of the deposition source and including a plurality of deposition source nozzles; and a patterning slit sheet facing the deposition source nozzle unit and including a plurality of patterning slits arranged along a direction, wherein the deposition source may be configured to discharge the deposition material to pass through the patterning slit sheet to be deposited on the substrate in a certain pattern.

The patterning slit sheet of the organic layer deposition assembly may be formed smaller than the substrate in at least any one of the first direction and a second direction perpendicular to the first direction.

A magnetic rail may be on a surface of the carrier, each of the first conveyer unit and the second conveyer unit may include a plurality of coils, wherein the magnetic rail and the plurality of coils may be combined together to constitute an operation unit for generating a driving force to move the transfer unit.

The first conveyer unit may include guide members each including an accommodation groove, wherein the respective accommodation grooves may be configured to accommodate both sides of the transfer unit, to guide the transfer unit to move in the first direction; and a magnetically suspended bearing that is configured to suspend the transfer unit from the accommodation grooves so as to move the transfer unit in a non-contact manner with the accommodation grooves.

The magnetically suspended bearing may include side magnetically suspended bearings arranged on both side surfaces of the carrier and upper magnetically suspended bearings arranged above the carrier.

According to another embodiment of the present invention, there is provided a method of manufacturing an organic light-emitting display device by using an organic layer deposition apparatus for forming an organic layer on a substrate, the method including: conveying, into a chamber, a transfer unit on which a substrate is fixed, by using a first conveyer unit installed to pass through the chamber, wherein the transfer unit includes a carrier including a contactless power supply (CPS) module and an electrostatic chuck fixedly coupled to the carrier to fix the substrate; forming an organic layer by depositing a deposition material discharged from an organic layer deposition assembly on the substrate while the substrate is moved relative to the organic layer deposition assembly with the organic layer deposition assembly in the chamber being spaced apart from the substrate by a set or predetermined distance; and conveying the transfer unit from which the substrate is separated to the loading unit by using a second conveyer unit installed to pass through the chamber, wherein the electrostatic chuck is charged by the CPS module while the transfer unit is conveyed in the conveying of the transfer unit by the first conveyer unit, the forming of the organic layer, and/or the conveying of the transfer unit by the second conveyer unit.

In the charging of the electrostatic chuck by the CPS module, a charging track may be formed in the second conveyer unit at a location corresponding to the CPS module so that a magnetic field is formed between the charging track and the CPS module to supply an electric power to the CPS module in a non-contact manner when the carrier is conveyed in the second conveyer unit.

The first conveyer unit may include a pair of guide rails that are formed in parallel with each other, and guide blocks coupled to the guide rails.

A charging track may be formed in the guide rails at a location corresponding to the CPS module so that a magnetic field is formed between the charging track and the CPS module to supply an electric power to the CPS module in a non-contact manner when the carrier is conveyed in the first conveyer unit.

The electrostatic chuck may further include an iron chuck formed at a side of the electrostatic chuck for adsorbing the substrate, and the substrate may contact the iron chuck.

The method may further include: fixing the substrate on the transfer unit in a loading unit before conveying the transfer unit by the first conveyer unit; and separating the substrate on which the depositing has been completed from the transfer unit in an unloading unit before conveying the transfer unit by the second conveyer unit.

The transfer unit may be cyclically moved between the first conveyer unit and the second conveyer unit.

The first conveyer unit and the second conveyer unit may be respectively arranged above and below in parallel to each other.

The organic layer deposition assembly may include: a deposition source discharging a deposition material; a deposition source nozzle unit disposed at a side of the deposition source and including a plurality of deposition source nozzles; and a patterning slit sheet facing the deposition source nozzle unit and including a plurality of patterning slits arranged along a second direction perpendicular to a first direction, wherein the deposition material discharged from the deposition source may pass through the patterning slit sheet to be deposited on the substrate in a certain pattern.

The patterning slit sheet of the organic layer deposition assembly may be formed smaller than the substrate in at least any one of the first direction and the second direction perpendicular to the first direction.

According to another embodiment of the present invention, there is provided an organic light-emitting display device including: a substrate; at least one thin film transistor on the substrate and including a semiconductor active layer, a gate electrode insulated from the semiconductor active layer, and source and drain electrodes each contacting the semiconductor active layer; a plurality of pixel electrodes on the thin film transistor; a plurality of organic layers on the plurality of the pixel electrodes; and a counter electrode disposed on the plurality of organic layers, wherein a length of a hypotenuse of at least one of the plurality of organic layers on the substrate farther from a center of a deposition region is larger than lengths of hypotenuses of those other organic layers formed closer to the center of the deposition region, and wherein the at least one of the plurality of organic layers on the substrate is a linearly-patterned organic layer formed using the organic layer deposition apparatus.

The substrate may have a size of 40 inches or more.

The plurality of organic layers may include at least an emission layer.

The plurality of organic layers may have a non-uniform thickness.

In each of the organic layers formed farther from the center of the deposition region, a hypotenuse farther from the center of the deposition region may be larger than the other hypotenuse.

The further one of the plurality of organic layers in the deposition region may be from the center of the deposition region, the narrower an overlapped region of two sides of the one of the plurality of organic layers is formed.

Hypotenuses of the organic layer disposed at the center of the deposition region may have substantially the same length.

The plurality of organic layers in the deposition region may be symmetrically arranged about the center of the deposition region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
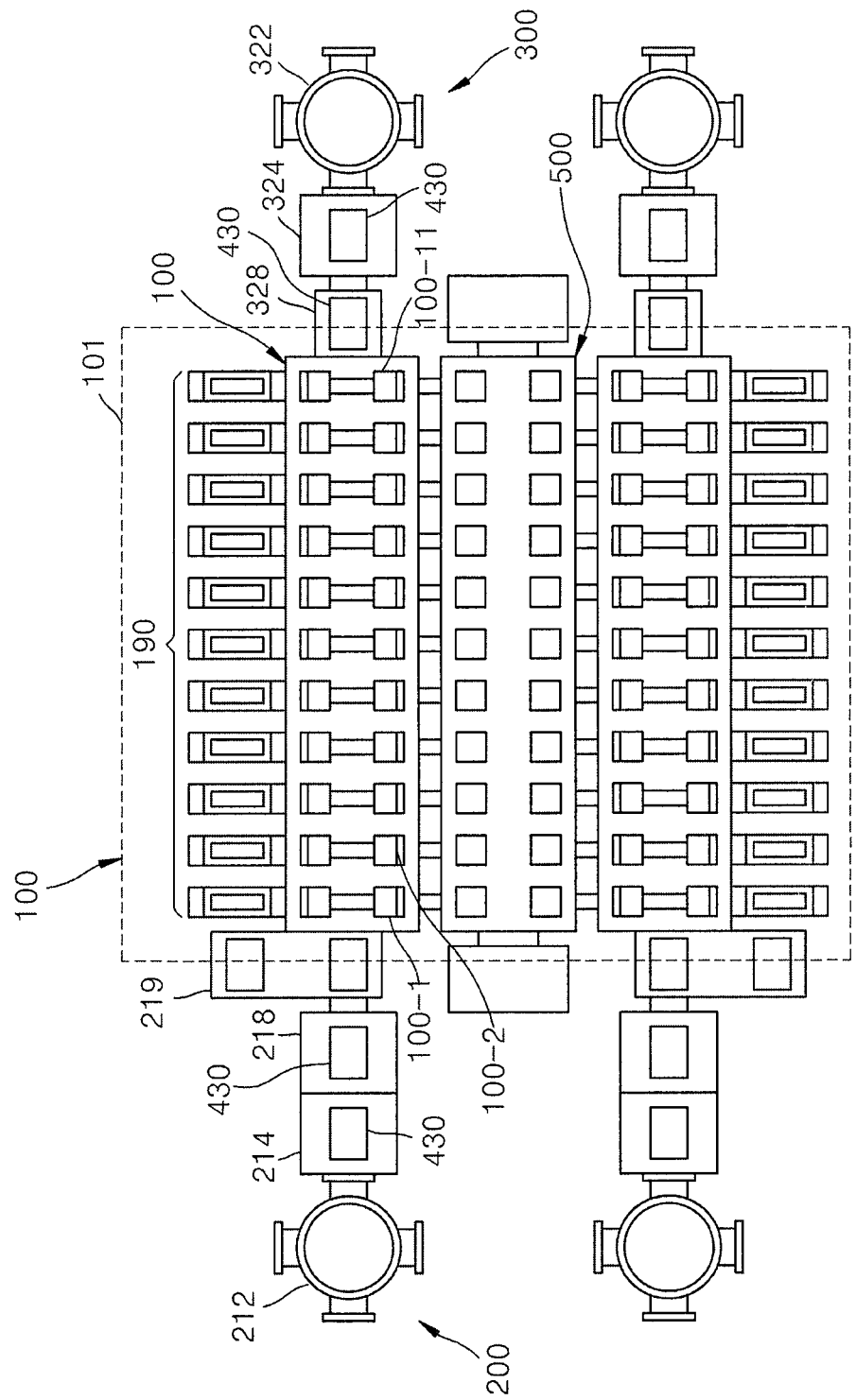
FIG. 1 is a schematic plan view illustrating a structure of an organic layer deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
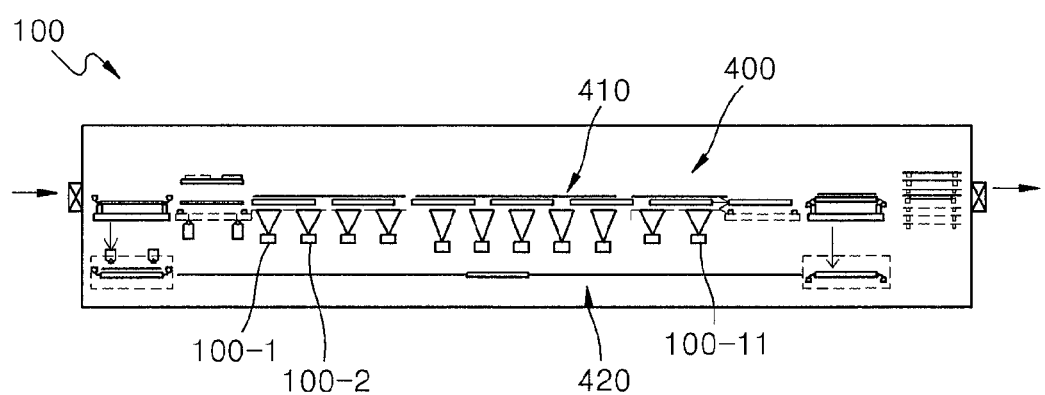
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, disposes it on a transfer unit 430 transferred by a second conveyer unit 420, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies (100-1) (100-2) ... (100-n) may be disposed. Referring to FIG. 1, 11 organic layer deposition assemblies, i.e., a first organic layer deposition assembly (100-1), a second organic layer deposition assembly (100-2), ... and an eleventh organic layer deposition assembly (100-11), are disposed in the chamber 101, but the number of organic layer deposition assemblies may vary with a desired deposition material and deposition conditions. The chamber 101 is maintained in vacuum during, the deposition process.

In this regard, some of the 11 organic layer deposition assemblies may be used for deposition to form a common layer, and the rest of the 11 organic layer deposition assemblies may be used for deposition to form a pattern layer. In this embodiment, the organic layer deposition assemblies used for deposition to form a common layer may not include a patterning slit sheet 130 (refer to FIG. 3).

In the embodiment illustrated in FIG. 1, the transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the transfer unit 430 from which the substrate 2 is separated.

In the present embodiment, the organic layer deposition apparatus 1 is configured such that the first conveyer unit 410 and the second conveyer unit 420 are respectively disposed above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 disposed at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. That is, it can be seen that two organic layer deposition apparatuses 1 are respectively arranged at one side and another side of the organic deposition apparatus 1 (above and below in FIG. 1). In such an embodiment, a patterning slit sheet replacement unit 500 may be disposed between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

Figure 3:
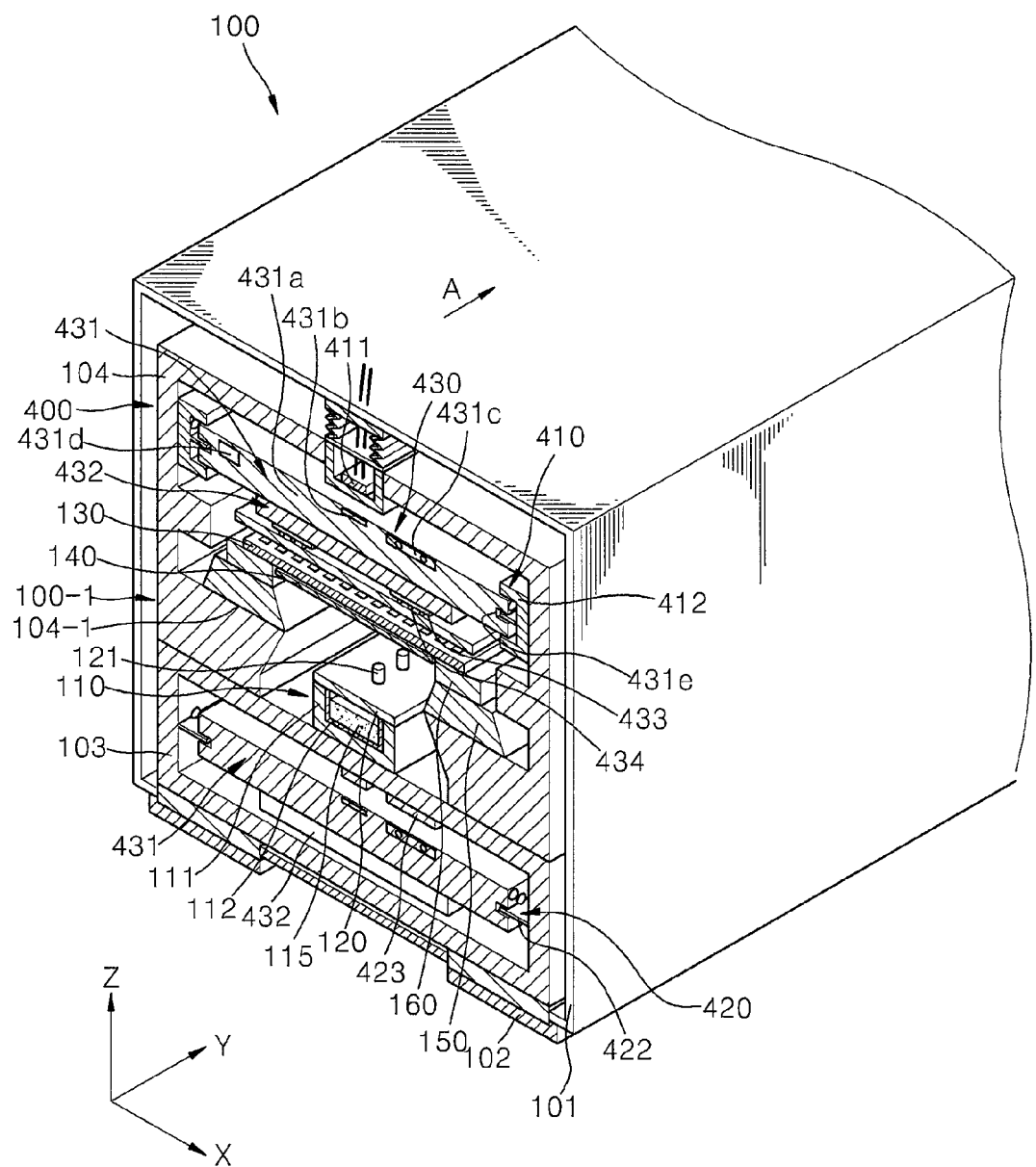
FIG. 3 is a schematic perspective view of the deposition unit of the organic layer deposition apparatus of FIG. 1, according to an embodiment of the present invention.
Figure 4:
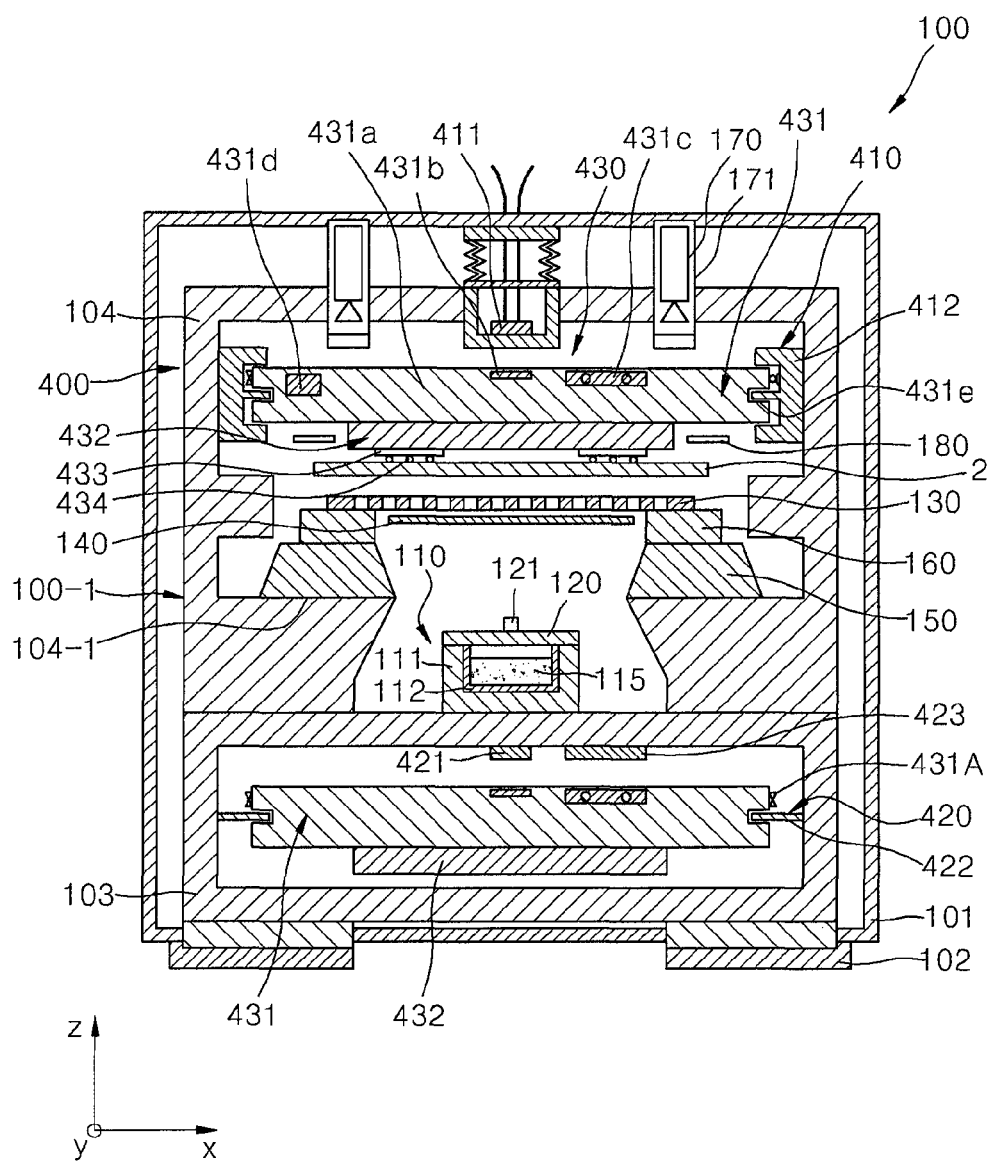
FIG. 4 is a schematic cross-sectional view of the deposition unit of FIG. 3, according to an embodiment of the present invention.
Figure 5:
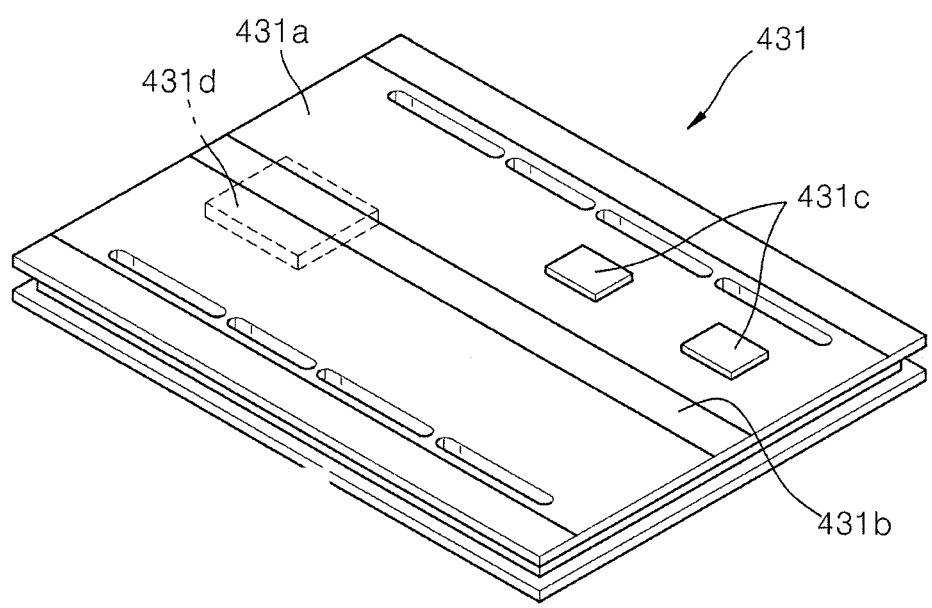
FIG. 5 is a detailed perspective view of a carrier of a transfer unit of the deposition unit shown in FIG. 3.
Figure 6:
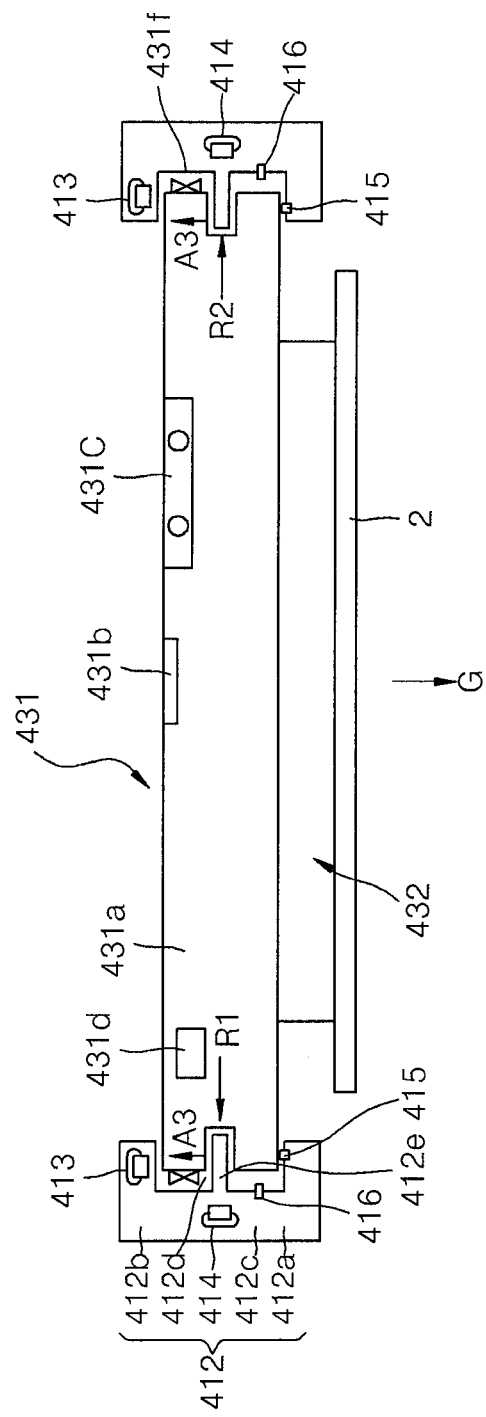
FIG. 6 is a detailed cross-sectional view of a first conveyer unit and a transfer unit of the deposition unit shown in FIG. 3.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention. FIG. 5 is a perspective view of a carrier 431 of the transfer unit 400 of the deposition unit 100 of FIG. 3, according to an embodiment of the present invention. FIG. 6 is a cross-sectional view of a first conveyer unit 410 and a transfer unit 420 of the deposition unit 100 of FIG. 3, according to an embodiment of the present invention.

First, referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the conveyer unit 400. In another descriptive manner, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, the patterning slit sheet 130, a shielding member 140, a first stage 150, a second stage 160, a camera 170, and a sensor 180. In this regard, all the elements illustrated in FIGS. 3 and 4 may be arranged in the chamber 101 maintained in an appropriate vacuum state. This structure is needed to achieve the linearity of a deposition material.

In particular, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method of an FMM. In addition, the temperature of the patterning slit sheet 130 should be sufficiently lower than that of the deposition source 110 (about 100° C. or less) because thermal expansion of the patterning slit sheet 130 is minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate, such as a mother glass, for manufacturing a plurality of flat panel displays, may be used as the substrate 2.

According to an embodiment, the deposition process may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber (not shown) in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. That is, the small patterning slit sheet 130 is more advantageous in the manufacturing processes, including etching followed by precise elongation, welding, transferring, and washing processes, than the FMM used in a conventional deposition method. In addition, this is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side in which the substrate 2 is disposed in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120 is disposed at a side of the deposition source 110, and in particular, at the side of the deposition source 110 facing the substrate 2. Here, in the organic layer deposition assembly according to the present embodiment, deposition nozzles for depositing a common layer and deposition nozzles for depositing pattern layers may be different from each other. That is, a plurality of deposition source nozzles 121 may be formed along the Y-axis direction, that is, a scanning direction of the substrate 2, in the deposition source nozzle unit 120 for forming the pattern layer. Accordingly, the deposition source nozzles 121 are arranged so that only one deposition source nozzle 121 exists in the X-axis direction, thereby reducing the occurrence of shadow. Alternatively, a plurality of deposition source nozzles 121 may be disposed along the X-axis direction in the deposition source nozzle unit 120 for forming the common layer, and thus, a thickness uniformity of the common layer may be improved.

A patterning slit sheet 130 is further disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

Here, the deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed in the same size. Accordingly, the mask needs to be large as the size of a display device increases. However, it is difficult to form a large mask.

To address these problems, in the organic layer deposition assembly 100-1 according to the present embodiment, the patterning slit sheet 130 is formed spaced apart by a certain distance from the substrate 2 on which a deposition material is to be deposited.

According to the present embodiment, deposition may be performed while a mask formed smaller than a substrate is moved with respect to the substrate, and thus, it is easy to manufacture the mask. In addition, defects due to contact between the substrate and the mask may be prevented. In addition, since it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 110 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be further disposed between the patterning slit sheet 130 and the deposition source 110 in order to prevent the organic material from depositing on a non-film-forming region of the substrate 2.

Although not particularly illustrated, the shielding member 140 may include two adjacent plates. Since the shielding member 140 shields the non-film-forming region of the substrate 2, deposition of the organic material on the non-film-forming region of the substrate 2 may be easily prevented without using an additional structure.

Hereinafter, the conveyer unit 400 for conveying the substrate 2 that is a deposition target will be described in more detail below. Referring to FIGS. 3 through 6, the conveyer unit 400 includes a first conveyer unit 410, a second conveyer unit 420, and a transfer unit 430.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached. Moreover, the transfer unit 430 may further include a film 433 formed on a surface of the electrostatic chuck 432, and an iron chuck 434 formed on a side of the film 433.

Hereinafter, each element of the conveyer unit 400 will be described in more detail.

The carrier 431 of the transfer unit 430 will now be described in detail.

Referring to FIG. 5, the carrier 431 includes a main body part 431a, a magnetic rail 431b, contactless power supply (CPS) modules 431c, a power supply unit 431d, and guide grooves 431e.

The main body part 431a constitutes a base part of the carrier 431 and may be formed of a magnetic material such as iron. In this regard, due to a repulsive force between the main body part 431a and the respective upper and side magnetically suspended bearings 413 and 414, which are described below, the carrier 431 may be maintained spaced apart from the guide members 412 by a certain distance.

The guide grooves 431e may be respectively formed at both sides of the main body part 431a and each of the guide grooves 431e may accommodate a guide protrusion 412e of the guide member 412.

The magnetic rail 431b may be formed along a center line of the main body part 431a in a direction where the main body part 431a proceeds. The LMS magnet 431b and the coil 411, which are described below in more detail, may be combined with each other to constitute a linear motor, and the carrier 431 may be conveyed in an arrow A direction by the linear motor.

The CPS modules 431c and the power supply unit 431d may be respectively formed on both sides of the LMS magnet 431b in the main body part 431a. The power supply unit 431d includes a battery (e.g., a rechargeable battery) that provides power so that the electrostatic chuck 432 can chuck the substrate 2 and maintains operation. The CPS modules 431c are wireless charging modules that charge the power supply unit 431d. In particular, the charging track 423 formed in the second conveyer unit 420, which is described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

As described above, since the power supply unit 431d may be charged wirelessly in the vacuum chamber by using the CPS modules 431c and the charging track 423, degradation of yield generated due to the occurrence of particles when using the conventional linear motion (LM) system may be prevented. Also, a possibility of breaking the deposition apparatus due to the occurrence of harmful spark may be reduced. Moreover, reduction of maintenance costs, improvement of the producibility, and increase in the life span may be obtained.

Meanwhile, the electrostatic chuck 432 includes a main body formed of ceramic and an electrode (to which an electric power is applied) buried in the main body, and when a high voltage is applied to the electrode, the substrate 2 is attached to a surface of the main body.

Also, the film 433 is formed on a side of the electrostatic chuck 432, and an iron chuck 434 may be further formed on a side of the film 433. Here, the iron chuck 434 functions as a kind of adsorption plate that adsorbs the substrate 2 attached to the electrostatic chuck 432 due to the high voltage applied to the electrostatic chuck 432 so as to stably fix the substrate 2.

Next, operations of the transfer unit 430 will be described below in more detail.

The LMS magnet 431b of the main body part 431a and the coil 411 may be combined with each other to constitute an operation unit. In this regard, the operation unit may be a linear motor. The linear motor has a small frictional coefficient, little position error, and a very high degree of position determination, as compared to a conventional slide guide system. As described above, the linear motor may include the coil 411 and the LMS magnet 431b. The LMS magnet 431b is linearly disposed on the carrier 431, and a plurality of the coils 411 may be disposed at an inner side of the chamber 101 by a certain distance so as to face the LMS magnet 431b. Since the LMS magnet 431b is disposed on the carrier 431 instead of the coil 411, the carrier 431 may be operable without power being supplied thereto. In this regard, the coil 411 may be formed in an atmosphere (ATM) box. The LMS magnet 431b is attached to the carrier 431 so that the carrier 431 may proceed within the vacuum chamber 101.

Next, the first conveyer unit 410 and the transfer unit 430 will be described in more detail below.

Referring to FIGS. 4 and 6, the first conveyer unit 410 conveys the electrostatic chuck 432 that fixes the substrate 2 and conveys the carrier 431 that conveys the electrostatic chuck 432. In this regard, the first conveyer unit 410 includes the coil 411, the guide members 412, the upper magnetically suspended bearings 413, the side magnetically suspended bearings 414, and the gap sensors 415 and 416.

The coil 411 and the guide members 412 are formed inside the upper housing 104. The coil 411 is formed in an upper portion of the upper housing 104, and the guide members 412 are respectively formed on both inner sides of the upper housing 104.

The guide members 412 guide the carrier 431 to move in a direction. In this regard, the guide members 412 are formed to pass through the deposition unit 100.

In particular, the guide members 412 accommodate both sides of the carrier 431 to guide the carrier 431 to move along in the direction of arrow A illustrated in FIG. 3. In this regard, the guide member 412 may include a first accommodation part 412*a* disposed below the carrier 431, a second accommodation part 412*b* disposed above the carrier 431, and a connection part 412*c* that connects the first accommodation part 412*a* and the second accommodation part 412*b*. An accommodation groove 412*d* is formed by the first accommodation part 412*a*, the second accommodation part 412*b*, and the connection part 412*c*. Both sides of the carrier 431 are respectively accommodated in the accommodation grooves 412*d*, and the carrier 431 is moved along the accommodation grooves 412*d*.

The side magnetically suspended bearings 414 are each disposed in the connection part 412*c* of the guide member 412 so as to respectively correspond to both sides of the carrier 431. The side magnetically suspended bearings 414 cause a distance between the carrier 431 and the guide member 412 so that the carrier 431 is moved along the guide members 412 in non-contact with the guide members 412. That is, a repulsive force R1 occurring between the side magnetically suspended bearing 414 on the left side and the carrier 431, which is a magnetic material, and a repulsive force R2 occurring between the side magnetically suspended bearing 414 on the right side and the carrier 431, which is a magnetic material, maintain equilibrium, and thus, there is a constant distance between the carrier 431 and the respective parts of the guide member 412.

Each upper magnetically suspended bearing 413 may be disposed in the second accommodation part 412*b* so as to be above the carrier 431. The upper magnetically suspended bearings 413 enable the carrier 431 to be moved along the guide members 412 in non-contact with the first and second accommodation parts 412*a* and 412*b* and with a distance therebetween maintained constant. That is, an attractive force A3 occurring between the upper magnetically suspended bearing 413 and the carrier 431, which is a magnetic material, and gravity G maintain equilibrium, and thus, there is a constant distance between the carrier 431 and the respective parts 412*a* and 412*b* of the guide members 412.

Each guide member 412 may further include the gap sensor 415. The gap sensor 415 may measure a distance between the carrier 431 and the guide member 412. Also, the gap sensor 416 may be disposed at a side of the side magnetically suspended bearing 414. The gap sensor 416 may measure a distance between a side surface of the carrier 431 and the side magnetically suspended bearing 414.

Magnetic forces of the upper and side magnetically suspended bearings 413 and 414 may vary according to values measured by the gap sensors 415 and 146, and thus, distances between the carrier 431 and the respective guide members 412 may be adjusted in real time. That is, a precise transfer of the carrier 431 may be feedback controlled using the upper and side magnetically suspended bearings 413 and 414 and the gap sensors 415 and 416.

Hereinafter, the second conveyer unit 420 and the transfer unit 430 are described in more detail.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In this regard, the second conveyer unit 420 includes the coil 421, the roller guides 422, and the charging track 423.

In particular, the coil 421, the roller guides 422, and the charging track 423 may be positioned inside the lower housing 103. The coil 421 and the charging track 423 may be disposed on a top inner surface of the lower housing 103, and the roller guides 422 may be disposed on both inner sides of the lower housing 103. Here, the coil 421 may be disposed in an ATM box, as the coil 411 of the first conveyer unit 410.

Like the first conveyer unit 410, the second conveyer unit 420 may include the coil 421. Also, the LMS magnet 431*b* of the main body part 431*a* of the carrier 431 and the coil 421 are combined with each other to constitute an operation unit. In this regard, the operation unit may be a linear motor. The carrier 431 may be moved by the linear motor along a direction opposite to the direction of arrow A illustrated in FIG. 3.

The roller guides 422 guide the carrier 431 to move in a direction. In this regard, the roller guides 422 are formed to pass through the deposition unit 100.

The second conveyer unit 420 is used in a process of returning the carrier 431 from which the substrate 2 has been separated and not in a process of depositing an organic material on the substrate 2, and thus, position accuracy thereof is not needed as by the first conveyer unit 410. Therefore, magnetic suspension is applied to the first conveyer unit 410 that requires high position accuracy, thereby obtaining position accuracy, and a conventional roller method is applied to the second conveyer unit 420 that requires relatively low position accuracy, thereby reducing manufacturing costs and simplifying a structure of the organic layer deposition apparatus. Although not illustrated in FIG. 4, the magnetic suspension may also be applied to the second conveyer unit 420 as in the first conveyer unit 410.

The organic layer deposition assembly 100-1 of the organic layer deposition apparatus 1 according to the present embodiment may further include the camera 170 and the sensor 180 for an aligning process. The camera 170 may align in real time a first alignment mark (not shown) formed in the frame 135 of the patterning slit sheet 130 and a second alignment mark (not shown) formed on the substrate 2. In addition, the sensor 180 may be a confocal sensor. As described above, since a distance between the substrate 2 and the patterning slit sheet 130 is measurable in real time using the camera 170 and the sensor 180, the substrate 2 may be aligned with the patterning slit sheet 130 in real time, whereby position accuracy of a pattern may be significantly improved.

Hereinafter, the deposition unit 100 according to another embodiment of the present invention will be described below.

Figure 7:
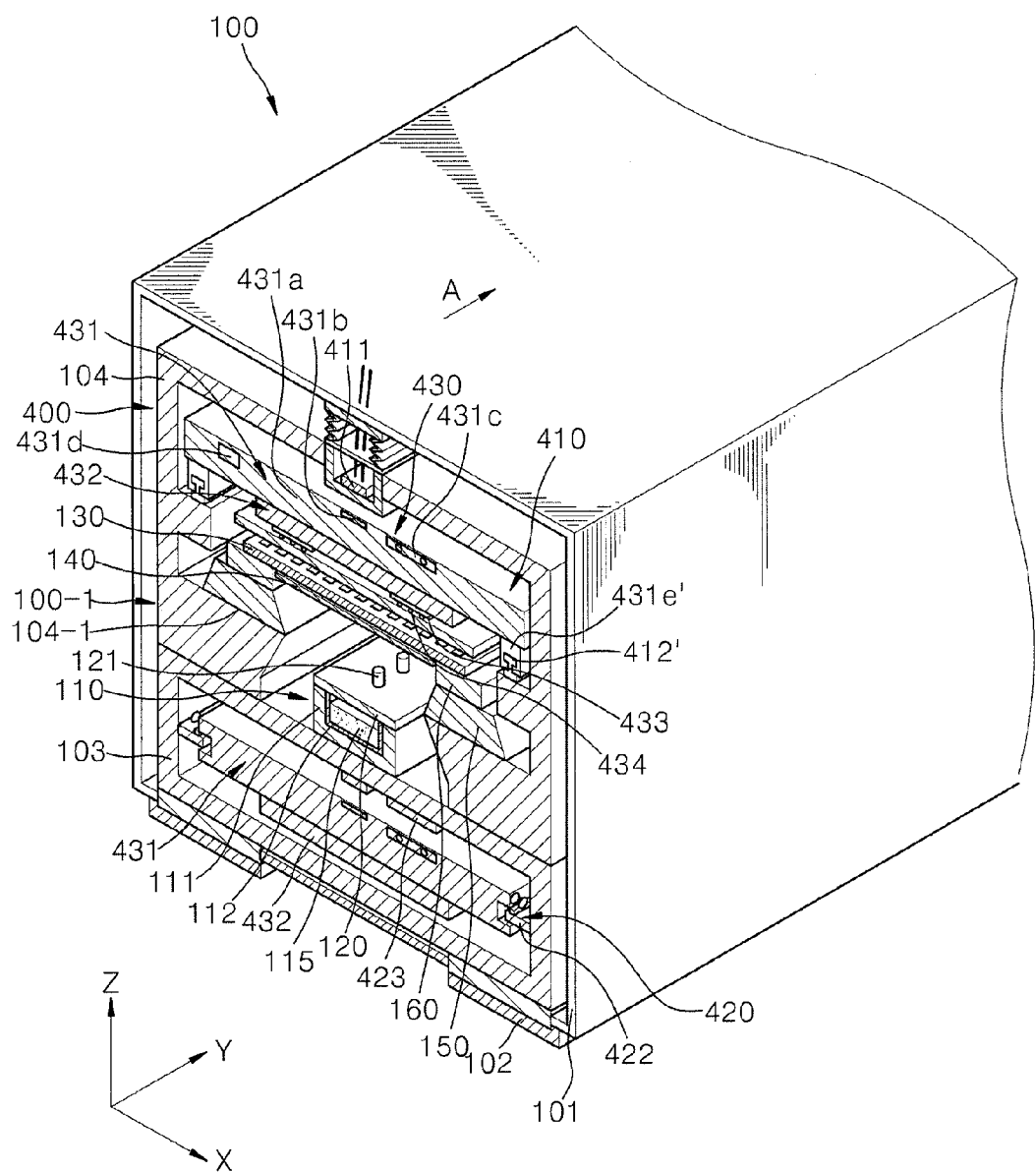
FIG. 7 is a schematic perspective view of a deposition unit of FIG. 1, according to another embodiment of the present invention.
Figure 8:
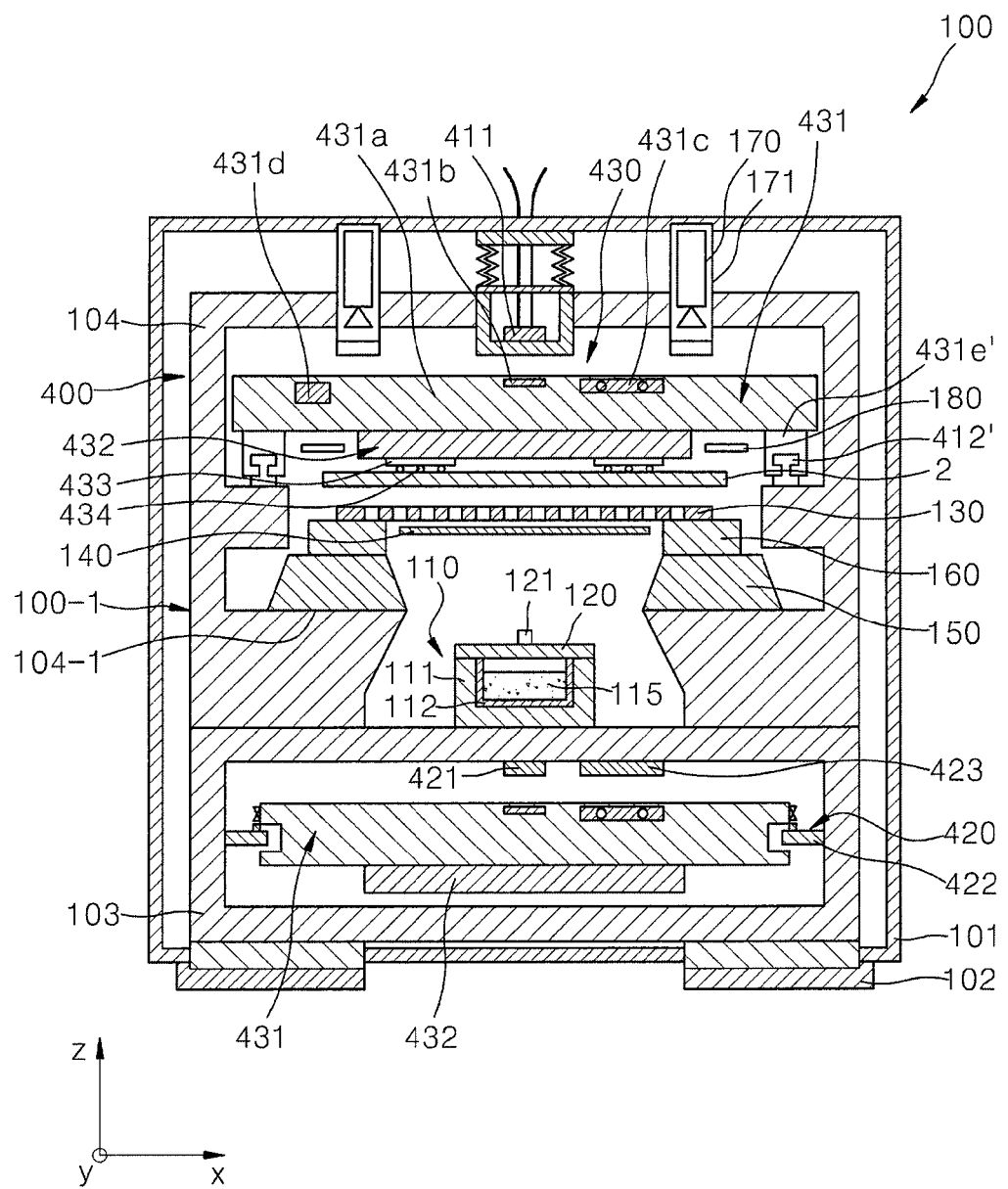
FIG. 8 is a schematic cross-sectional view of the deposition unit of FIG. 7.

FIG. 7 is a schematic perspective view of the deposition unit 100 of FIG. 1, and FIG. 8 is a schematic cross-sectional view of the deposition unit 100 of FIG. 7.

Referring to FIGS. 7 and 8, according to the present embodiment, guides 412' of the first conveyer unit 410 and the carrier 431 of the transfer unit 430 are different from those of the previous embodiment, which will be described in detail below.

The first conveyer unit 410 conveys in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1. The first conveyer unit 410 includes a coil 411, guide rails 412', upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422', and a charging track 423.

The transfer unit 430 includes the carrier 431 that is conveyed along the first conveyer unit 410 and the second conveyer unit 420 and the electrostatic chuck 432 that is combined on a surface of the carrier 431 and to which the substrate 2 is attached. Moreover, the transfer unit 430 may further include the film 433 formed on a surface of the electrostatic chuck 432, and the iron chuck 434 formed at a side of the film 433.

Here, the guide members 412' of the first conveyer unit 410 are formed as guide rails, and the carrier 431 of the transfer unit 430 includes guide blocks 431e' that are coupled to the guide members 412.

In particular, in the present embodiment, the deposition is performed when the electrostatic chuck to which the substrate is fixed moves linearly in the chamber. In this case, if the electrostatic chuck is conveyed by a conventional roller or a conveyer, the position accuracy of the substrate degrades, and if the magnetic suspension method is used shown in FIGS. 3 and 4, manufacturing costs of the deposition apparatus increase. Thus, in the present embodiment, a linear motion system including the guide rails and the guide blocks is applied in order to convey the substrate accurately while manufacturing the deposition apparatus easily.

In particular, inner surfaces of the upper housing 104 are formed as flat, and a pair of guide rails 412' are formed on the inner surface of the upper housing 104. Also, the guide blocks 431e' are inserted in the guide rails 412' so as to reciprocate along the guide rails 412'.

Although not shown in FIGS. 7 and 8, the charging track may be further formed in the guide rails 412'. That is, in a state where the CPS module 431c is disposed on at least one of opposite edges of the main body part 431a, that is, on a region where the guide rails 412' are formed, the charging track (not shown) may be formed in the guide rails 412'. Then, when the carrier 431 is conveyed in the first conveyer unit 410, a magnetic field is formed between the charging track (not shown) and the CPS module 431c so as to supply electric power to the CPS module 431c in a non-contact manner. That is, when the transfer unit 430 is conveyed in the first conveyer unit 410, the power supply unit 431d may be charged.

Hereinafter, a structure of an organic layer formed using the organic layer deposition apparatus 1 described above is described in more detail.

Figure 9:
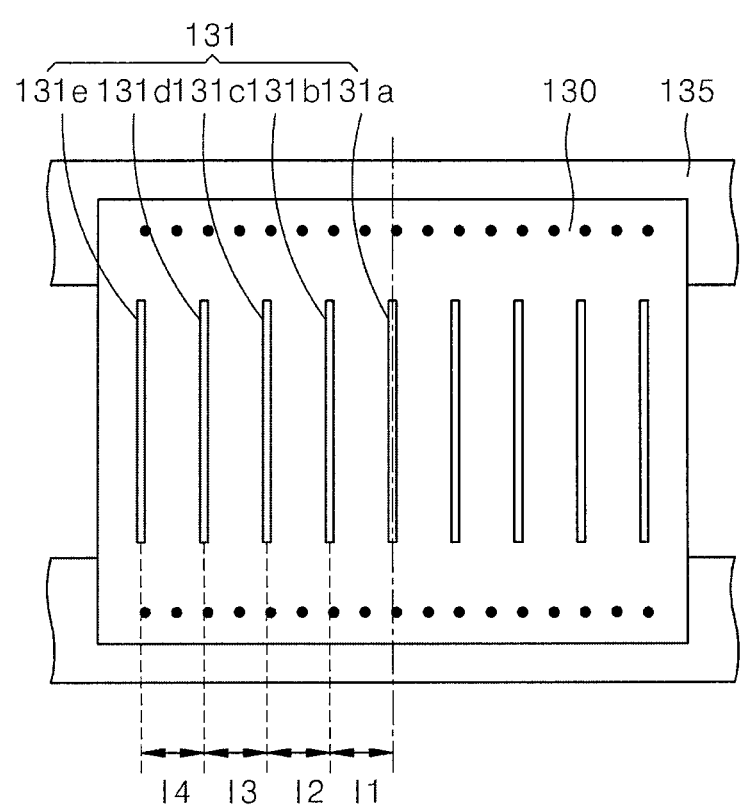
FIG. 9 is a diagram illustrating a structure in which patterning slits are arranged at equal intervals in a patterning slit sheet of the organic layer deposition apparatus including the deposition unit of FIG. 3, according to an embodiment of the present invention.
Figure 10:
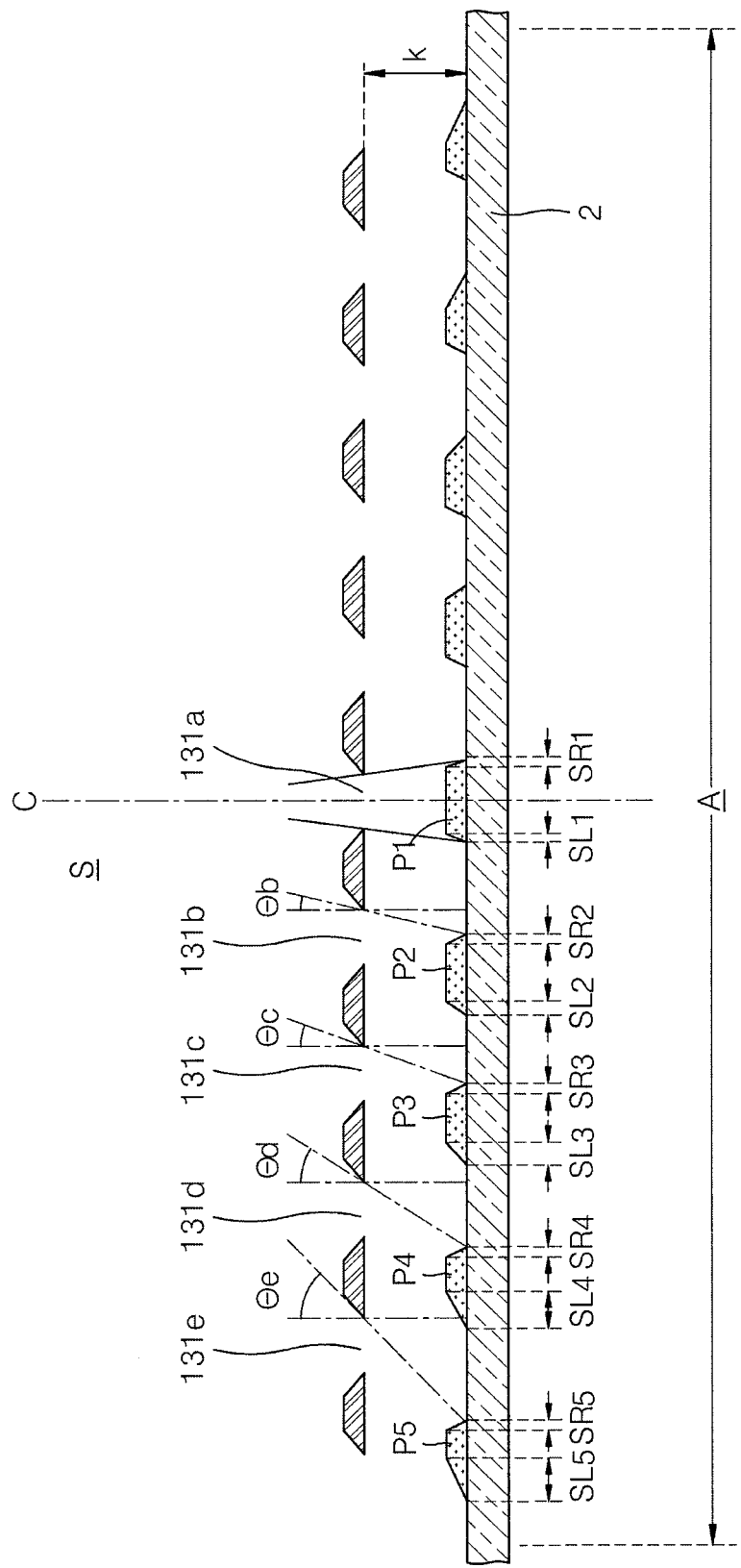
FIG. 10 is a diagram illustrating organic layers formed on a substrate by using the patterning slit sheet of FIG. 9, according to an embodiment of the present invention.

FIG. 9 is a diagram illustrating a structure in which the patterning slits 131 are arranged at equal intervals in the patterning slit sheet 130 of the organic layer deposition apparatus 1, according to an embodiment of the present invention. FIG. 10 is a diagram illustrating organic layers formed on the substrate 2 by using the patterning slit sheet 130 of FIG. 9, according to an embodiment of the present invention.

FIGS. 9 and 10 illustrate the patterning slit sheet 130 in which the patterning slits 131 are arranged at equal intervals. That is, in FIG. 9, the patterning slits 131 satisfy the following condition: $I_1=I_2=I_3=I_4$.

In this embodiment, an incident angle of a deposition material discharged along a center line C of a deposition space S is substantially perpendicular to the substrate 2. Thus, an organic layer $P_1$ formed using the deposition material that has passed through a patterning slit 131a has a minimum size of a shadow, and a right-side shadow $SR_1$ and a left-side shadow $SL_1$ are formed symmetrical to each other.

However, a critical incident angle θ of the deposition material that passes through patterning slits disposed farther from the center line C of the deposition space S gradually increases, and thus, the critical incident angle θ of the deposition material that passes through the outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the critical incident angle θ of the deposition material increases, the size of the shadow also increases. In particular, the size of the shadow at a position farther from the center line C of the deposition space S increases. In addition, the critical incident angle θ of the deposition material increases as a distance between the center line C of the deposition space S and the respective patterning slits increases. Thus, organic layers formed using the deposition material that passes through the patterning slits disposed farther from the center line C of the deposition space S have a larger shadow size. In particular, of the shadows on both sides of the respective organic layers, the size of the shadow at a position farther from the center line C of the deposition space S is larger than that of the other.

That is, referring to FIG. 10, the organic layers formed on the left side of the center line C of the deposition space S have a structure in which a left hypotenuse is larger than a right hypotenuse, and the organic layers formed on the right side of the center line C of the deposition space S have a structure in which a right hypotenuse is larger than a left hypotenuse.

Also, in the organic layers formed on the left side of the center line C of the deposition space S, the length of the left hypotenuse increases towards the left. In the organic layers formed on the right side of the center line C of the deposition space S, the length of the right hypotenuse increases towards the right. Consequently, the organic layers formed in the deposition space S may be formed symmetrical to each other about the center line C of the deposition space S.

This structure will now be described in more detail.

The deposition material that passes through a patterning slit 131b passes through the patterning slit 131b at a critical incident angle of $\theta_b$, and an organic layer $P_2$ formed using the deposition material that has passed through the patterning slit 131b has a left-side shadow having a size of $SL_2$. Similarly, the deposition material that passes through a patterning slit 131c passes through the patterning slit 131c at a critical incident angle of $\theta_c$, and an organic layer $P_3$ formed using the deposition material that has passed through the patterning slit 131c has a left-side shadow having a size of $SL_3$. Similarly, the deposition material that passes through a patterning slit 131d passes through the patterning slit 131d at a critical incident angle of $\theta_d$, and an organic layer $P_4$ formed using the deposition material that has passed through the patterning slit 131d has a left-side shadow having a size of $SL_4$. Similarly, the deposition material that passes through the patterning slit 131e passes through the patterning slit 131e at a critical incident angle of $\theta_e$, and an organic layer $P_5$ formed using the deposition material that has passed through the patterning slit 131e has a left-side shadow having a size of $SL_5$.

In this regard, the critical incident angles satisfy the following condition: $\theta_b<\theta_c<\theta_d<\theta_e$, and thus, the sizes of the shadows of the organic layers also satisfy the following condition: $SL_1<SL_2<SL_3<SL_4<SL_5$.

Figure 11:
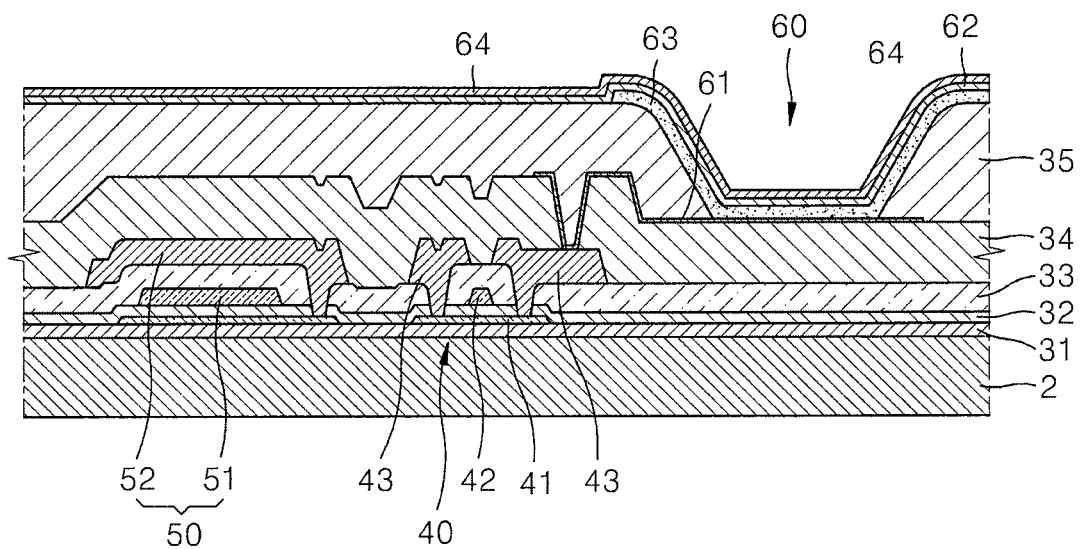
FIG. 11 is a cross-sectional view of an active matrix-type organic light-emitting display device manufactured using the organic layer deposition apparatus, according to an embodiment of the present invention.

FIG. 11 is a cross-sectional view of an active matrix-type organic light-emitting display device manufactured using the organic layer deposition apparatus 1, according to an embodiment of the present invention.

Referring to FIG. 11, the active matrix organic light-emitting display device 10 according to the current embodiment is formed on the substrate 2. The substrate 2 may be formed of a transparent material, for example, glass, plastic, or metal.

An insulating layer 31, such as a buffer layer, is formed on an entire surface of the substrate 2.

A thin film transistor (TFT) 40, a capacitor 50, and an organic light-emitting diode (OLED) 60 are disposed on the insulating layer 31, as illustrated in FIG. 11.

A semiconductor active layer 41 is formed on an upper surface of the insulating layer 31 in a set or predetermined pattern. A gate insulating layer 32 is formed to cover the semiconductor active layer 41. The semiconductor active layer 41 may include a p-type or n-type semiconductor material.

A gate electrode 42 of the TFT 40 is formed in a region of the gate insulating layer 32 corresponding to the semiconductor active layer 41. An interlayer insulating layer 33 is formed to cover the gate electrode 42. The interlayer insulating layer 33 and the gate insulating layer 32 are etched by, for example, dry etching, to form a contact hole exposing parts of the semiconductor active layer 41.

Source/drain electrodes 43 are formed on the interlayer insulating layer 33 to contact the semiconductor active layer 41 through the contact hole. A passivation layer 34 is formed to cover the source/drain electrodes 43, and is etched to expose a part of one of the source/drain electrodes 43. An insulating layer (not shown) may be further formed on the passivation layer 34 so as to planarize the passivation layer 34.

In addition, the OLED 60 displays set or predetermined image information by emitting red, green, or blue light according to current. The OLED 60 includes a first electrode 61 disposed on the passivation layer 34. The first electrode 61 is electrically connected to the exposed source/drain electrode 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes the surface of a region of the substrate 30 in which the first electrode 61 is formed, and in particular, the surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using the organic layer deposition apparatus 1 illustrated in FIGS. 1 through 8. That is, an organic layer deposition apparatus including a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein is disposed spaced apart by a set or predetermined distance from a substrate on which the deposition material is to be deposited. In addition, the deposition material discharged from the organic layer deposition apparatus 1 (refer to FIG. 1) is deposited on the substrate 2 (refer to FIG. 1) while the organic layer deposition apparatus 1 and the substrate 2 are moved relative to each other.

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 62 may also be formed as a transparent electrode or a reflective electrode. When the second electrode 62 is formed as a transparent electrode, the second electrode 62 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. When the second electrode 62 is formed as a reflective electrode, the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

The organic layer deposition apparatuses according to the embodiments of the present invention described above may be applied to form an organic layer or an inorganic layer of an organic TFT, and to form layers from various materials.

As described above, the one or more embodiments of the present invention provide organic layer deposition apparatuses that are suitable for use in the mass production of a large substrate and enable high-definition patterning, methods of manufacturing organic light-emitting display devices by using the same, and organic light-emitting display devices manufactured using the methods.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting display device by using an organic layer deposition apparatus for forming an organic layer on a substrate, the method comprising:
    conveying, into a deposition unit comprising a chamber, a transfer unit on which a substrate is fixed, by using a first conveyer unit installed to pass through the chamber in a first direction, wherein the transfer unit comprises a carrier comprising:
        a contactless power supply (CPS) module; and
        an electrostatic chuck fixedly coupled to the carrier to fix the substrate;
    forming an organic layer by depositing a deposition material discharged from an organic layer deposition assembly on the substrate while the substrate is moved relative to the organic layer deposition assembly with the organic layer deposition assembly in the chamber being spaced apart from the substrate by a distance; and
    conveying the transfer unit from which the substrate is separated to a loading unit by using a second conveyer unit installed to pass through the chamber,
    wherein the electrostatic chuck is charged by the CPS module while the transfer unit is conveyed in the conveying of the transfer unit by the first conveyer unit, the forming of the organic layer, and/or the conveying of the transfer unit by the second conveyer unit.

2. The method of claim 1, wherein in the charging of the electrostatic chuck by the CPS module, a charging track is formed in the second conveyer unit at a location corresponding to the CPS module so that a magnetic field is formed between the charging track and the CPS module to supply an electric power to the CPS module in a non-contact manner when the carrier is conveyed in the second conveyer unit.

3. The method of claim 1, wherein the first conveyer unit comprises a pair of guide rails that are formed in parallel with each other, and guide blocks coupled to the guide rails.

4. The method of claim 3, wherein a charging track is formed in the guide rails at a location corresponding to the CPS module so that a magnetic field is formed between the charging track and the CPS module to supply an electric power to the CPS module in a non-contact manner when the carrier is conveyed in the first conveyer unit.

5. The method of claim 1, wherein the electrostatic chuck further comprises an iron chuck formed at a side of the electrostatic chuck for adsorbing the substrate, and the substrate contacts the iron chuck.

6. The method of claim 1, further comprising:
    fixing the substrate on the transfer unit in the loading unit before conveying the transfer unit by the first conveyer unit; and
    separating the substrate on which the depositing has been completed from the transfer unit in an unloading unit before conveying the transfer unit by the second conveyer unit.

7. The method of claim 1, wherein the transfer unit is cyclically moved between the first conveyer unit and the second conveyer unit.

8. The method of claim 1, wherein the first conveyer unit and the second conveyer unit are respectively arranged above and below in parallel to each other.

9. The method of claim 1, wherein the organic layer deposition assembly comprises:
    a deposition source discharging a deposition material;
    a deposition source nozzle unit disposed at a side of the deposition source and comprises a plurality of deposition source nozzles; and
    a patterning slit sheet facing the deposition source nozzle unit and comprising a plurality of patterning slits arranged along a second direction perpendicular to the first direction,
    wherein the deposition material discharged from the deposition source passes through the patterning slit sheet to be deposited on the substrate in a certain pattern.

10. The method of claim 9, wherein the patterning slit sheet of the organic layer deposition assembly is formed smaller than the substrate in at least any one of the first direction and the second direction.

11. The method of claim 1, further comprising:
    separating the substrate on which the depositing has been completed from the transfer unit in an unloading unit before conveying the transfer unit by the second conveyer unit,
    wherein the first conveyer unit is configured to sequentially convey the transfer unit into the loading unit, the deposition unit, and the unloading unit.

12. The method of claim 1, further comprising:
    separating the substrate on which the depositing has been completed from the transfer unit in an unloading unit before conveying the transfer unit by the second conveyer unit,
    wherein the second conveyer unit is configured to sequentially convey the transfer unit into the unloading unit, the deposition unit, and the loading unit.

13. The method of claim 1, wherein a magnetic rail is on a surface of the carrier, each of the first conveyer unit and the second conveyer unit comprises a plurality of coils, wherein the magnetic rail and the plurality of coils are combined together to constitute an operation unit for generating a driving force to move the transfer unit.

14. The method of claim 1, wherein the first conveyer unit comprises guide members each comprising an accommodation groove, wherein the respective accommodation grooves are configured to accommodate both sides of the transfer unit, to guide the transfer unit to move in the first direction; and a magnetically suspended bearing that is configured to suspend the transfer unit from the accommodation grooves so as to move the transfer unit in a non-contact manner with the accommodation grooves.

15. The method of claim 14, wherein the magnetically suspended bearing comprises side magnetically suspended bearings arranged on both side surfaces of the carrier and upper magnetically suspended bearings arranged above the carrier.

* * * * *